United States Patent
Pietrasz et al.

(10) Patent No.: US 9,343,749 B2
(45) Date of Patent: May 17, 2016

(54) ULTRATHIN PLATINUM FILMS

(71) Applicant: Ford Global Technologies, LLC, Dearborn, MI (US)

(72) Inventors: Patrick Pietrasz, Southgate, MI (US); Jun Yang, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 482 days.

(21) Appl. No.: 13/904,439

(22) Filed: May 29, 2013

(65) Prior Publication Data

US 2014/0356765 A1 Dec. 4, 2014

(51) Int. Cl.
| | |
|---|---|
| C23C 16/00 | (2006.01) |
| H01M 4/92 | (2006.01) |
| C23C 16/455 | (2006.01) |
| C23C 16/02 | (2006.01) |
| C23C 16/18 | (2006.01) |
| C23C 16/442 | (2006.01) |
| H01M 4/88 | (2006.01) |
| H01M 8/10 | (2016.01) |
| C23C 16/44 | (2006.01) |

(52) U.S. Cl.
CPC ........... *H01M 4/925* (2013.01); *C23C 16/0272* (2013.01); *C23C 16/18* (2013.01); *C23C 16/442* (2013.01); *C23C 16/45536* (2013.01); *C23C 16/45553* (2013.01); *C23C 16/45555* (2013.01); *C23C 16/4417* (2013.01); *H01M 4/8803* (2013.01); *H01M 2008/1095* (2013.01); *Y02E 60/50* (2013.01)

(58) Field of Classification Search
None
See application file for complete search history.

(56) References Cited

U.S. PATENT DOCUMENTS

| | | | |
|---|---|---|---|
| 6,576,538 B2 | 6/2003 | Li et al. | |
| 6,918,960 B2 | 7/2005 | Li et al. | |
| 8,062,552 B2 | 11/2011 | Adzic et al. | |
| 2002/0182876 A1* | 12/2002 | Kawai | H01J 37/32477 438/706 |
| 2003/0091890 A1* | 5/2003 | Fukuda | H01M 4/8605 429/535 |
| 2003/0165615 A1 | 9/2003 | Aaltonen et al. | |
| 2006/0121733 A1 | 6/2006 | Kilpela et al. | |
| 2007/0259111 A1 | 11/2007 | Singh et al. | |
| 2008/0146042 A1 | 6/2008 | Kostamo et al. | |
| 2011/0020546 A1 | 1/2011 | Hamalainen et al. | |
| 2012/0100301 A1 | 4/2012 | Kongkanand et al. | |

OTHER PUBLICATIONS

Knoops, ECS Transactions, 16(4), p. 209-218, 2008.*
Lim Nature Materials vol. 2 Nov. 2003 p. 749-754.*

(Continued)

*Primary Examiner* — Joseph Miller, Jr.
(74) *Attorney, Agent, or Firm* — Damian Porcari; Brooks Kushman P.C.

(57) ABSTRACT

In at least one embodiment, a method of forming a platinum thin film is provided, including performing a first atomic layer deposition (ALD) process on a substrate using a first platinum organometallic precursor in a first step and an oxidizing precursor in a second step to form an at least partially coated substrate. A second ALD process is then performed on the at least partially coated substrate using a second platinum organometallic precursor in a first step and a reducing precursor in a second step to form a thin film of platinum on the substrate. The first ALD process may be performed for 5 to 150 cycles to nucleate platinum on the substrate surface and the second ALD process may be performed thereafter to grow the thin film and remove surface oxides. A conformal platinum thin film having a thickness of 1 to 10 monolayers may be deposited.

15 Claims, 2 Drawing Sheets

(56) References Cited

OTHER PUBLICATIONS

Hamalainen Chem Mater 2008 V20 p. 6840-6846.*
Utriainen App Surf Science V157 2000 p. 151-158.*
T. Wagner et al., "Epitaxy of Pd thin films on (100) SrTiO3: A three-step growth process", Journal of Applied Physics, Nov. 13, 2000, p. 2606-2612, vol. 89, No. 5.
T. Aaltonen et al., "Atomic Layer Deposition of Platinum Thin Films", Chemistry of Materials, Apr. 9, 2003, Abstract, vol. 15, Issue 9.
B. S. Lim et al., "Atomic layer deposition of transition metals", Nature Materials, Oct. 26, 2003, p. 749-754, vol. 2.
A. J. Francis et al., "Epitaxial growth of Cu(100) and Pt(100) thin films on perovskite substrates", Thin Solid Films 496, Oct. 7, 2005, p. 317-325.
H. C. M. Knoops et al., "Remote Plasma ALD of Platinum and Platinum Oxide Films", Electrochemical and Solid-State Letters, Apr. 27, 2009, p. G34-G36, vol. 12, Issue 7.
H. B. Profijt et al., "Plasma-Assisted Atomic Layer Deposition: Basics, Opportunities, and Challenges", Journal of Vacuum Science and Technology A, Aug. 18, 2011, p. (050801-1)-(050801-26), vol. 29, No. 5.
A. J. M. Mackus et al., "Catalytic Combustion and Dehydrogenation Reactions during Atomic Layer Deposition of Platinum", Chemistry of Materials, Apr. 17, 2012, p. 1752-1761, vol. 24.

* cited by examiner

ULTRATHIN PLATINUM FILMS

TECHNICAL FIELD

One or more embodiments relate to a method of depositing platinum thin films.

BACKGROUND

Fuel cells, for example, hydrogen fuel cells, are one possible alternative energy source for powering vehicles. In general, fuel cells include a negative electrode (anode), an electrolyte, and a positive electrode (cathode). In a proton exchange membrane fuel cell (PEMFC), the electrolyte is a solid, proton-conducting membrane that is electrically insulating but allows protons to pass through. Typically, the fuel source, such as hydrogen, is introduced at the anode where it reacts with a catalyst and splits into electrons and protons. The protons travel through the electrolyte to the cathode and the electrons pass through an external circuit and then to the cathode. At the cathode, oxygen in the air reacts with the electrons and the protons at another catalyst to form water. One or both of the catalysts are generally formed of a noble metal or a noble metal alloy, typically platinum or a platinum alloy.

SUMMARY

In at least one embodiment, a method of forming a platinum thin film is provided, comprising performing a first atomic layer deposition (ALD) process on a substrate using a first platinum organometallic precursor in a first step and an oxidizing precursor in a second step to form an at least partially coated substrate. A second ALD process is then performed on the at least partially coated substrate using a second platinum organometallic precursor in a first step and a reducing precursor in a second step to form a thin film of platinum on the substrate.

In on embodiment, the oxidizing precursor is an oxygen plasma. In another embodiment, the reducing precursor is a hydrogen plasma. The substrate may include a plurality of particles and the plurality of particles may be disposed in a fluidized bed during the first and second performing steps. In one embodiment, the substrate is a metal oxide. In another embodiment, the substrate is a plurality of particles of one or more of yttria-stabilized zirconia (YSZ), Nb2O5, niobium doped titanium oxide, iridium oxide, and rhodium oxide.

The first ALD process may be performed for 10 to 100 cycles. In one embodiment, the substrate surface has a surface contour and the second ALD process forms a platinum thin film that conforms to the surface contour and has a thickness of 1 to 10 monolayers. In some embodiments, the first and second platinum organometallic precursors are the same. The first and second platinum organometallic precursors may be trimethyl(methylcyclopentadienyl)platinum.

In at least one embodiment, a method is provided, comprising depositing a first platinum organometallic precursor on a substrate surface, applying an oxidizing precursor to the first platinum organometallic precursor to form a first platinum coating on the substrate surface, depositing a second platinum organometallic precursor on the first platinum coating and on the substrate surface, and applying a reducing precursor to the second platinum organometallic precursor to form a platinum catalyst thin film on the substrate surface.

In one embodiment, the depositing of the first platinum organometallic precursor and the applying of the oxidizing precursor is performed for 25 to 75 cycles. In another embodiment, the depositing of the second platinum organometallic precursor and the applying of the reducing precursor is performed for 1 to 5,000 cycles. The substrate may be a plurality of particles and the method may further comprise mixing the particles, after the reducing precursor is applied, with a cation-conducting polymer and a solvent to form a catalyst mixture and applying the catalyst mixture to one of a fuel cell electrode and a separator to form a catalyst layer, once dried.

In at least one embodiment, a catalyst layer for a fuel cell is provided, comprising a cation-conducting polymer and a plurality of metal oxide particles, each of the plurality of particles having a substantially continuous thin film of platinum on its surface having a thickness of 1 to 10 monolayers.

In one embodiment, the plurality of particles is one or more of yttria-stabilized zirconia (YSZ), Nb2O5, niobium doped titanium oxide, iridium oxide, and rhodium oxide. The substantially continuous thin film of platinum may have a thickness of 2 to 6 monolayers and may be strained. The catalyst layer may further include a plurality of conductive particles present in an amount of 1 to 50 percent by weight of the catalyst layer.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
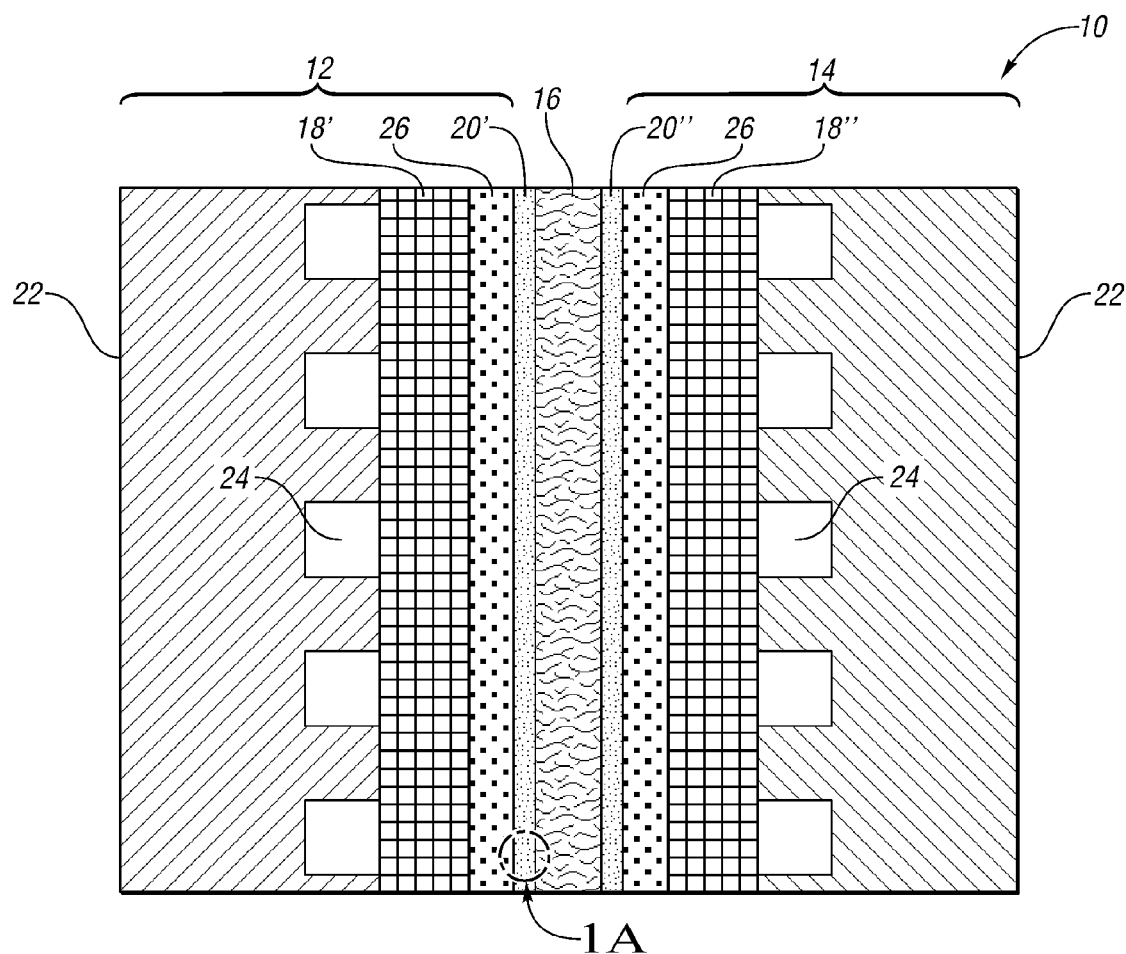
FIG. 1 is a schematic drawing of a PEMFC fuel cell.

With reference to FIG. 1, an example of a PEMFC 10 is illustrated. The PEMFC 10 generally includes a negative electrode (anode) 12 and a positive electrode (cathode) 14, separated by a proton exchange membrane (PEM) 16 (also a polymer electrolyte membrane). The anode 12 and the cathode 14 may each include a gas diffusion layer (GDL) 18, a catalyst layer 20, and a flow field plate 22 which forms a gas channel 24. The catalyst layer 20 may be the same for the anode 12 and the cathode 14, however, the anode 12 may have a catalyst layer 20' and the cathode 14 may have a different catalyst layer 20". The catalyst layer 20' may facilitate the splitting of hydrogen atoms into hydrogen ions and electrons while the catalyst layer 20" facilitates the reaction of oxygen gas and electrons to form water. In addition, the anode 12 and cathode 14 may each include a microporous layer (MPL) 26 disposed between the GDL 18 and the catalyst layer 20.

Figure 1A:
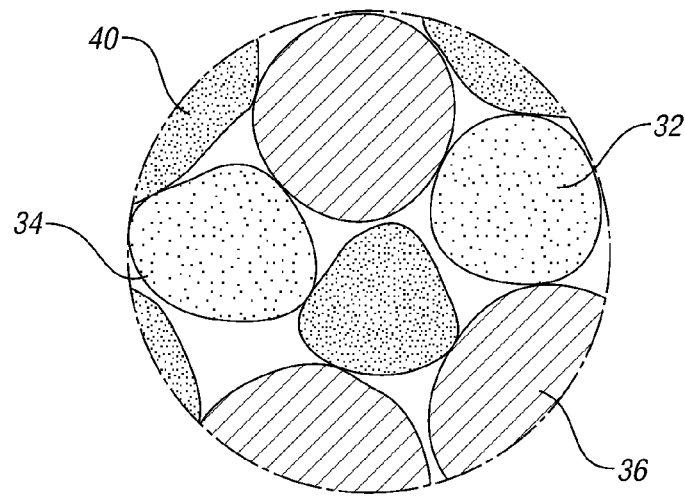
FIG. 1A is a magnified and isolated view of a catalyst layer of the fuel cell of FIG. 1.

The catalyst layer 20 may include a noble metal or a noble metal alloy. In one embodiment, the catalyst layer 20 includes platinum or a platinum alloy. With reference to FIG. 1A, in at least one embodiment, the catalyst layer includes a catalyst support 30 which may support or have deposited thereon a catalyst material layer 32 (e.g., the noble metal, noble metal alloy, platinum, and/or platinum alloy). The catalyst support 30 may be a powder or particulate 34. In one embodiment, each of the catalyst support particles has a size of 10 to 200 nm. In another embodiment, each of the support particles has a size of 20 to 150 nm. In another embodiment, each of the support particles has a size of 25 to 100 nm. In another embodiment, each of the support particles has a size of 25 to 75 nm. In another embodiment, each of the support particles has a size of 30 to 60 nm.

After the catalyst material layer 32 has been deposited on the catalyst support particles 34, the particles may be combined with a cation-conducting polymer 36 and a solvent to form an ink or paste 38 (not shown). The polymer 36 may be any suitable cation-conducing polymer, such as a sulfonated tetrafluoroethylene based fluoropolymer-copolymer. One such suitable polymer is Nafion® by DuPont™. The solvent may be any solvent able to dissolve the particles 34 and polymer, for example, a water and alcohol mixture. In addition to the particles 34 and polymer 36, conductive particles 40 may be included in the ink 38. The particles 40 may also be a diluent. Any suitable conductive particles may be used, for example, carbon black. The particles 40 may, if present, comprise 1 to 75% by weight of the ink 38. In another embodiment, the particles comprise 1 to 50% by weight of the ink 38.

The ink 38 including catalyst support particles 34, polymer 36, and optionally conductive particles 40 may then be applied onto one of the separator 16 and the GDL 18 to form the catalyst layer 20, once dried. If the fuel cell 10 includes an MPL 26, then the ink 38 may be applied to it. The ink 38 may be applied by any suitable method, for example, coating in a decal process, casting, or knife blade coating. The anode 12, GDL 18, catalyst layer 20, and separator 16 are then pressed together to form a membrane electrode assembly (MEA). The same process may be done with the cathode 14 to form a cathode MEA.

Typical deposition processes, such as chemical vapor deposition (CVD) and sputtering may deposit platinum thin films. However, the films are highly porous and do not exhibit bulk-like properties until the thickness of the films are in the tens of monolayers. Another method of platinum deposition is atomic layer deposition (ALD), in which cycles of two half-reactions are repeated to deposit thin films in a self-limiting manner. In general, the ALD process involves exposing a substrate to a first precursor, purging the first precursor, exposing the substrate to a second precursor, and purging the second precursor. These four steps include one cycle, which may be repeated in order to form a thin-film of desired thickness. Thin-film deposition of platinum catalysts by ALD shares similar problems to those done by CVD and sputtering, the layer must be 10 s of monolayers thick before bulk-like properties are obtained. For oxygen plasma ALD, the platinum layer tends to follow a Stranski-Krastanov growth process in which initially the platinum nucleates on the substrate surface forming "islands." Once a sufficient number of islands have been formed, further cycles of oxygen plasma ALD produce a thin film of platinum. However, to develop a film having bulk-like properties, the film must be at least 12 monolayers thick (about 5 nm) and hundreds of cycles must be performed. Using hydrogen plasma ALD on a substrate surface results in minimal or no nucleation and film growth, without the addition of an intermediate layer, such as tungsten.

Figure 2:
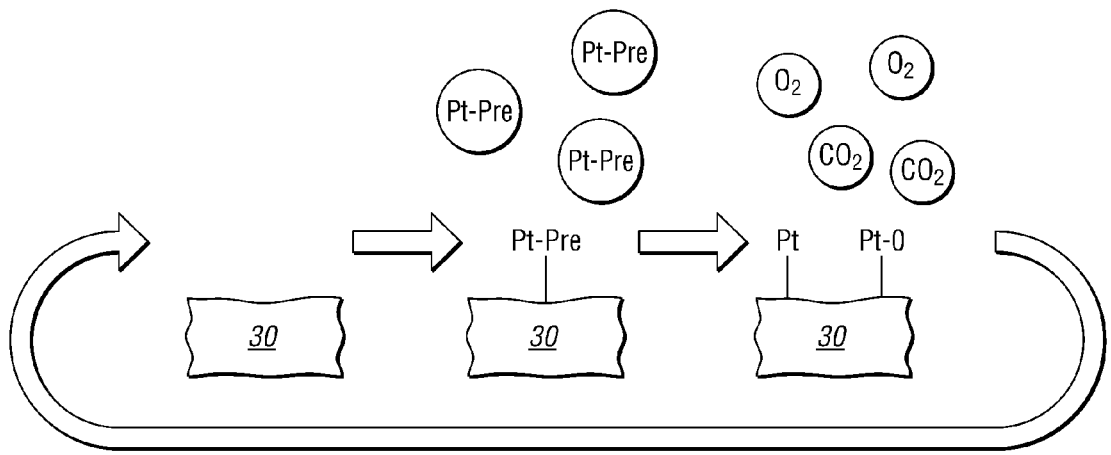
FIG. 2 is a schematic drawing of a first stage of an ALD process according to an embodiment.
Figure 3:
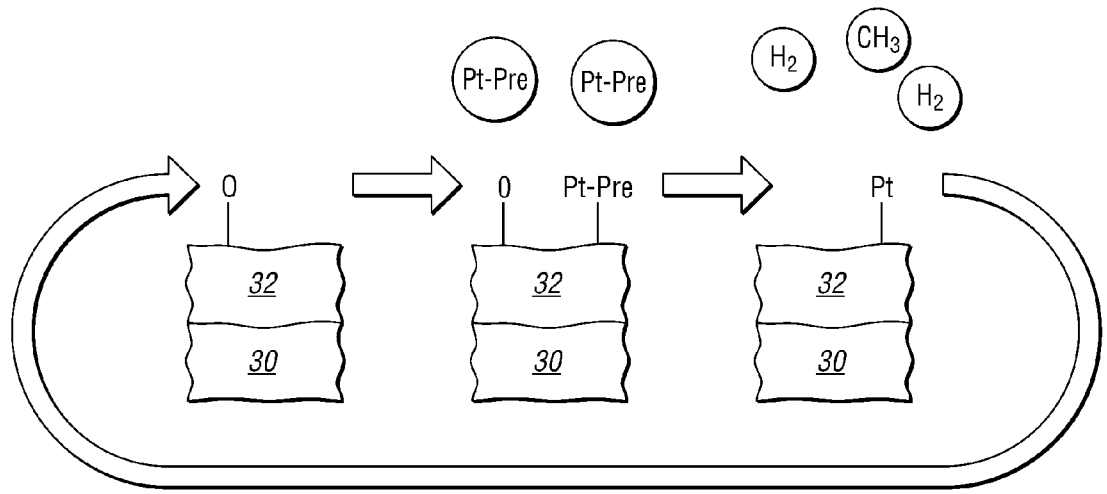
FIG. 3 is a schematic drawing of a second stage of an ALD process according to an embodiment.
Figure 4:
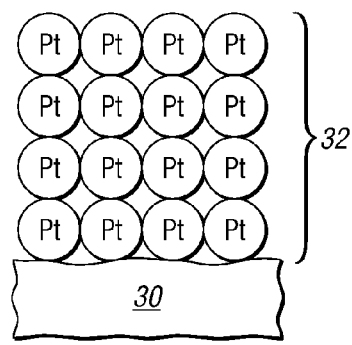
FIG. 4 is a schematic drawing of a platinum thin film on a substrate following a two-stage ALD process according to an embodiment.

With reference to FIGS. 2 and 3, a multiple stage ALD process is shown for growing a platinum thin-film catalyst material layer 32 on a substrate 30, which may be particles 34.

In at least one embodiment, the substrate is a catalyst support 30, which may be catalyst support particles 34. In at least one embodiment, the process is a two-stage ALD process in which the first stage includes performing ALD using a platinum precursor and an oxygen plasma for a first number of cycles and the second stage includes performing ALD using a platinum precursor and a hydrogen plasma for a second number of cycles. During the two-stage ALD process, the platinum precursor for either or both stages may be an organometallic platinum, such as trimethyl(methylcyclopentadienyl) platinum gas. Without being held to any particular theory, it is believed that the first stage of ALD using oxygen plasma results in nucleation of platinum on the substrate surface and fixes the grain boundaries of the platinum and that subsequent ALD using hydrogen plasma results in uniform platinum deposition and removes surface oxides. Using the two-stage ALD process, uniform platinum deposition can be performed at smaller thicknesses, while still achieving bulk-like properties in the thin film.

In one embodiment the first stage includes performing an ALD process using a platinum precursor and an oxidizing precursor, such as oxygen plasma, for 5 to 150 cycles. In another embodiment, the first stage includes performing an ALD process using a platinum precursor and oxygen plasma for 10 to 100 cycles. In another embodiment, the first stage includes performing an ALD process using a platinum precursor and oxygen plasma for 25 to 100 cycles. In another embodiment, the first stage includes performing an ALD process using a platinum precursor and oxygen plasma for 25 to 75 cycles. In another embodiment, the first stage includes performing an ALD process using a platinum precursor and oxygen plasma for 30 to 60 cycles. In another embodiment, the first stage includes performing an ALD process using a platinum precursor and oxygen plasma for 40 to 60 cycles. In another embodiment, the first stage includes performing an ALD process using a platinum precursor and oxygen plasma for about 50 cycles.

The first stage ALD process may be performed at any suitable substrate temperature. In one embodiment, the temperature of the substrate is from 150 to 350° C. In another embodiment, the temperature of the substrate is from 175 to 325° C. In another embodiment, the temperature of the substrate is from 200 to 325° C. In another embodiment, the temperature of the substrate is about 300° C. In addition, in any of the embodiments described above or below, the oxygen plasma may be replaced with an argon plasma containing vapor of $H_2O$, $O_2$, $O_3$, and/or $H_2O_2$, unless otherwise stated.

An embodiment of the process that occurs during the first stage ALD process is shown in FIG. 2. The ALD process may take place in a vacuum chamber. In some embodiments, the substrate is in the form of particles or powder, in which case the particles may be present in the form of a fluidized bed. In the first step, the substrate is exposed to a platinum precursor gas (shown as "Pt-Pre") and a portion of the precursor adsorbs to the surface of the substrate. This step may have a predetermined time or saturation may be determined by monitoring the precursor gas using, for example, a residual gas analyzer (RGA). In the second step, the platinum precursor is purged by any suitable means, such as vacuum or by injecting an inert gas. In the third step, an oxidizing precursor is introduced, such as oxygen plasma. The adsorbed platinum precursor is highly reactive towards oxygen and reacts with the oxidizing precursor to leave metallic platinum on the substrate surface. A portion of the metallic platinum may react with the oxygen to form a platinum oxide. This step may have a predetermined time or saturation may be determined by monitoring the release of reactant gases, such as $CO_2$, using, for example, a residual gas analyzer (RGA). In the fourth step, the oxidizing precursor and gaseous reactants are purged by any suitable means, such as vacuum or by injecting an inert gas. Steps 1-4 constitute one cycle, which may be repeated as described previously to nucleate platinum on the substrate surface. In the second and subsequent cycles, the platinum precursor adsorbs to portions of the substrate surface that are still exposed after the previous cycle, as well as onto deposited platinum and/or platinum oxides.

Following the first stage, a second ALD process may be performed in the second stage using a platinum precursor and a reducing precursor, such as hydrogen plasma. In one embodiment the second stage includes performing an ALD process using a platinum precursor and hydrogen plasma for 1 to 5,000 cycles. In another embodiment the second stage includes performing an ALD process using a platinum precursor and hydrogen plasma for 10 to 3,000 cycles. In another embodiment the second stage includes performing an ALD process using a platinum precursor and hydrogen plasma for 50 to 1,000 cycles. In another embodiment the second stage includes performing an ALD process using a platinum precursor and hydrogen plasma for 100 to 1,000 cycles. The ranges of the number of cycles in the second stage are not exhaustive, however, and any suitable range may be used to accomplish a desired film thickness.

An embodiment of the process that occurs during the second stage ALD process is shown in FIG. 3. The second ALD process may also take place in a vacuum chamber. In embodiments where the substrate is in the form of particles or powder, particles may still be present in the form of a fluidized bed. In the first step, the substrate having nucleated platinum deposited on its surface is exposed to a platinum precursor gas and a portion of the precursor adsorbs to uncovered portions of the surface of the substrate and the nucleated platinum. This step may have a predetermined time or saturation may be determined by monitoring the precursor gas using, for example, an RGA. In the second step, the platinum precursor is purged by any suitable means, such as vacuum or by injecting an inert gas. In the third step, a reducing precursor is introduced, such as hydrogen plasma. The adsorbed platinum precursor is highly reactive towards hydrogen and reacts with the reducing precursor to leave metallic platinum on the substrate surface. In addition to depositing metallic platinum, the reducing precursor may reduce the platinum oxide deposited during the first stage ALD, leaving just metallic platinum. With no oxides coating the metallic platinum, the nucleated grains from the first stage ALD are able to grow and the space between the nucleation sites are filled in to create a thin, continuous, and/or conformal layer of platinum on the substrate surface. This step may have a predetermined time or saturation may be determined by monitoring the release of reactant gases, such as methane, using, for example, a residual gas analyzer (RGA). In the fourth step, the oxidizing precursor and gaseous reactants are purged by any suitable means, such as vacuum or by injecting an inert gas. Steps 1-4 constitute one cycle, which may be repeated as described previously to grow the platinum thin film on the substrate surface. In the second and subsequent cycles, the platinum precursor adsorbs to portions of the substrate surface that are still exposed after the previous cycle, as well as onto deposited platinum.

The two-stage ALD process may be used with any suitable substrate. In some embodiments, the substrate 30 is a material that is resistant to oxidation and/or non-reactive towards platinum deposition by an oxygen plasma ALD process. The substrate may be in the form of particles or powder 34. In one embodiment, the substrate or particles are a metal oxide or a conductive metal oxide. Non-limiting examples of such oxides include yttria-stabilized zirconia (YSZ), $Nb_2O_5$, niobium doped titanium oxide, iridium oxide, and rhodium oxide.

In one embodiment, the catalyst material layer 32 is 1 to 30 monolayers thick. In another embodiment, the catalyst material layer 32 is 1 to 20 monolayers thick. In another embodiment, the catalyst material layer 32 is 1 to 10 monolayers thick. In another embodiment, the catalyst material layer 32 is 2 to 8 monolayers thick. In another embodiment, the catalyst material layer 32 is 2 to 6 monolayers thick. In another embodiment, the catalyst material layer 32 is 2 to 5 monolayers thick. In another embodiment, the catalyst material layer 32 is about 4 monolayers thick.

The two-stage ALD process and the resulting platinum catalyst material layer 32 may have several important advantages over current processes and catalyst layers. First, since the platinum catalyst material layer 32 may be reduced to 10 monolayers or less, for example 2 to 6 or 2 to 4 monolayers, the amount of platinum used in the catalyst material layer 32 may be reduced. As platinum is a very expensive metal, reductions in the amount used in fuel cells will make the fuel cell itself less expensive, and therefore more attractive as an energy source in, for example, vehicles. In addition, the two-stage ALD process enables continuous and/or conformal thin films of platinum on a powder/particle substrate at thicknesses of less than 10 monolayers. The thin film may follow or conform to a surface contour of the substrate, whether it is a flat surface, a rough surface, or a particle. As described above, pure oxygen plasma ALD requires at a minimum about 12 monolayers in order to achieve full coverage of the substrate, and even then the film is not a smooth layer but rather a collection of nucleated islands that together cover the substrate surface. Moreover, it is believed that thin films having a thickness of under 10 monolayers may exhibit increased activity towards the oxygen reduction reaction (ORR) as a result of being in a strained state, as opposed to bulk layers (e.g., over 10 monolayers), in which strain is relaxed. Without being held to any particular theory, it is believed that a thickness of about 4 monolayers is the optimal thickness of the platinum layer on a powder/particle surface. At a thickness of about 4 monolayers, the platinum film may fully cover the substrate surface (e.g., the film may be continuous) and also maintain some strain in the layer, increasing activity.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:
1. A method of forming a platinum thin film comprising:
performing a first atomic layer deposition (ALD) process on a substrate using a first platinum organometallic precursor in a first step and an oxidizing precursor in a second step, the first ALD process excluding a reducing precursor;
repeating the first ALD process for a plurality of cycles, the plurality of cycles of the first ALD process at least partially coating the substrate with metallic platinum;
performing a second ALD process on the at least partially coated substrate using a second platinum organometallic precursor in a first step and a reducing precursor in a second step, the second ALD process excluding an oxidizing precursor; and repeating the second ALD process for a plurality of cycles, the plurality of cycles of the second ALD process forming a thin film of metallic platinum on the substrate.

2. The method of claim 1, wherein the oxidizing precursor in the first ALD process is an oxygen plasma.

3. The method of claim 1, wherein the reducing precursor in the second ALD process is a hydrogen plasma.

4. The method of claim 1, wherein the substrate includes a plurality of particles.

5. The method of claim 4, further comprising disposing the plurality of particles in a fluidized bed during the first and second performing steps.

6. The method of claim 1, wherein the substrate is a metal oxide.

7. The method of claim 1, wherein the substrate is a plurality of particles of one or more of yttria-stabilized zirconia (YSZ), $Nb_2O_5$, niobium doped titanium oxide, iridium oxide, and rhodium oxide.

8. The method of claim 1, wherein the first ALD process is performed for 10 to 100 cycles.

9. The method of claim 1, wherein a surface of the substrate has a surface contour and the second ALD process forms a platinum thin film that conforms to the surface contour and has a thickness of 1 to 10 monolayers.

10. The method of claim 1, wherein the first and second platinum organometallic precursors are the same.

11. The method of claim 10, wherein the first and second platinum organometallic precursors are trimethyl(methylcyclopentadienyl)platinum.

12. A method comprising:
a) depositing a first platinum organometallic precursor on a substrate surface;
b) applying only an oxygen plasma to the first precursor;
repeating steps a)-b) thereby forming a metallic platinum coating on the substrate;
c) depositing a second platinum organometallic precursor on the metallic platinum coating and the substrate;
d) applying only a hydrogen plasma to the second precursor;
repeating steps c)-d), thereby forming a metallic platinum catalyst thin film on the substrate.

13. The method of claim 12, wherein steps a)-b) are repeated for 25 to 75 cycles.

14. The method of claim 12, wherein steps c)-d) are repeated for 10 to 3,000 cycles.

15. The method of claim 12, wherein the substrate is a plurality of particles and the method further comprises mixing the particles, after the hydrogen plasma is applied, with a cation-conducting polymer and a solvent to form a catalyst mixture; and applying the catalyst mixture to one of a fuel cell electrode and a separator to form a catalyst layer, once dried.

* * * * *